US006331710B1

(12) United States Patent
Wang et al.

(10) Patent No.: US 6,331,710 B1
(45) Date of Patent: Dec. 18, 2001

(54) REFLECTIVE OPTICAL SYSTEMS FOR EUV LITHOGRAPHY

(76) Inventors: Zhijiang Wang, 23637 Country View Dr., Diamond Bar, CA (US) 91765; Junhua Pan, Nanjing, Banchang St. #188, Jiangsu (CH)

( * ) Notice: Subject to any disclaimer, the term of this patent is extended or adjusted under 35 U.S.C. 154(b) by 0 days.

(21) Appl. No.: 09/203,712

(22) Filed: Dec. 2, 1998

(51) Int. Cl.[7] .................................................. G02B 13/14
(52) U.S. Cl. .......................................... 250/492.2; 378/34
(58) Field of Search ............................. 250/492.2; 378/34

(56) References Cited

U.S. PATENT DOCUMENTS

| | | |
|---|---|---|
| 5,063,586 | 11/1991 | Jewell . |
| 5,212,588 | 5/1993 | Viswanathan . |
| 5,220,590 | 6/1993 | Brunning . |
| 5,257,139 | 10/1993 | Higuchi ................ 359/859 |
| 5,315,629 | 5/1994 | Jewell . |
| 5,353,322 | 10/1994 | Brunning . |
| 5,805,365 | 9/1998 | Sweatt . |
| 6,072,852 * | 6/2000 | Hudyma ............ 250/492.2 |

OTHER PUBLICATIONS

Murakami, "Soft X–ray Projection Imaging at 4.5 nm using Schwarzschild Optics" OSA Proceedings on Extream Ultraviolet Lithography vol. 23 pp 122–125 1994.

Kurihara, "Two mirror Telecentric Optics for Soft X–ray Reduction Lithography" J. Vac. Sci. Technol. B9(6) 1991 PP3189–3192.

Tichenor. "10X Reduction at 13.4 nm," OSA Proceedings on Extreme UV Litho. vol. 23 P89–97 (1994).

Hawryluk. "EUV Lithography", Solid State Technol. (1997) Jul. P151–159, Aug. P75–78.

Cohen. "Critical Illumin. Condenser for EUV Proj. Lithography" OSA Proceedings on EUV. vol. 23 PP109–115, 1994.

* cited by examiner

Primary Examiner—Bruce Anderson

(57) ABSTRACT

A novel projection lithography camera is disclosed with a large field area and large numerical aperture. The camera comprises only two aspheric mirrors with a two-reflection configuration. The two mirrors are arranged on a common axis of symmetry such that efficient use of extreme ultraviolet radiation can be achieved. In one preferred embodiment, a reduced image of mask is formed by reflection of the two mirrors on a wafer with feature sizes less than 0.05 $\mu$m over a field larger than 22 mm×22 mm with the NA being larger than 0.22. The system is appropriate for EUV steppers.

8 Claims, 7 Drawing Sheets

REFLECTIVE OPTICAL SYSTEMS FOR EUV LITHOGRAPHY

BACKGROUND OF THE INVENTION

This invention relates generally to an optical imaging system for soft x-ray or extreme ultraviolet (EUV) lithography, more specifically to a two-mirror optical imaging system with a two-reflection configuration.

Improvements of the cost and function of integrated circuits have largely depended on the ability to print smaller dimensions. In order to print smaller feature sizes, lithographic systems operate at shorter exposure wavelengths and use larger numerical apertures. This trends is expected to continue down to $\lambda=193$ nm exposure for the production of 180 nm structures. Unfortunately, refractive optical systems are unlikely to operate at wavelengths much shorter than 193 nm, making reflective optical systems necessary. During the past several years, extreme ultraviolet lithography (EUVL, or soft x-ray projection lithography) has evolved from simple concept into a possible candidate for the mass production of future integrated circuits. The progress of EUVL was reviewed thoroughly in an article titled "EUV Lithography" by Hawryluk et al (Solid State Technology, July 1997, p151, and August 1997, p75).

In the optical system for EUV lithography, multiple-mirrors have been employed to successively reflect beams of light to produce images of distant objects. The EUV optical designs with best image quality are those with the largest number of mirrors. However, since the best reflector we can reasonably expect in EUV is 70% reflectivity and maybe 60%, each additional mirror reduces the energy reaching the wafer and lowers the throughput. In fact, the inherent loss in a design can render the design inoperable. Such limitation leads to the requirement of using more laser power, which dramatically increases the equipment cost and cost of wafer exposure.

In the hope of optimizing the optical imaging system for EUV lithography, many efforts have been made in the optical design. Various EUV imaging systems having a configuration of three- or four-mirrors have been proposed. These designs are represented in U.S. Pat. Nos. 5,805,365, 5,353,322, 5,315,629, 5,257,139, 5,220,590, and 5,063,586. Imaging systems having two mirrors but with four reflections are also described, such as in U.S. Pat. No. 5,212,588. Although mechanically simpler, the reduction of energy due to those reflections is as significant as in four-mirror systems. Most of these designs are only useful for a narrow slit ring-field. In these systems a large exposure field is achieved by scanning the mask and the wafer in the opposite directions at a different speed which is precise equal to the reduction ratio of the imaging system. Therefore it increases the cost of equipment, and the smaller instant ring-field decreases the energy throughput.

Kurihara et al has proposed a two-mirror system for EUV or soft x-ray reduction lithography, (J. Vac. Sci. Technol. B9, 1991, p3189) which is also a narrow slit ring-field system with a very narrow ring width. Various two-mirror Schwarzschild systems have also been demonstrated for EUV imaging, but these typically have a very small field-of-view (such as 25×50, $\mu$m), which is too small to be useful for production (Tichenor et al, and Murakami et al, OSA Proceedings on EUV Lithography, Vol 23, 1994, p89 and p122).

It is well known that Lagrange invariant of optical system is the product of the beam solid angle (square of numerical aperture, $NA^2$) and the image field area. The product is an invariant from radiation source, condenser, projection objective to image plane. The radiation power can be transmitted from radiation source to image is the product of Lagrange invariant and the brightness of source. Therefore it is desired that the Lagrange invariant of an optical system is as large as possible. The optical system for EUV lithography described in U.S. Pat. No. 5,805,365 has only a small Lagrange invariant with a field area of 25 mm×7 mm and NA 0.085. The Lagrange invariant of the systems in other prior arts is even smaller.

A need therefore exists in the art for an EUV lithographic projection system that uses an all reflective optical design yet provide high system throughput by achieving high efficiency of energy utilization. Such design will also lead to lower system cost and ease of fabrication.

SUMMARY OF THE INVENTION

Accordingly, it is an object of the present invention to provide an optical imaging system to achieve greater efficiency in the utilization of the energy from radiation source.

It is also an object of the present invention to provide a lithographic camera with a wide image field and large numerical aperture.

It is yet another object of the present invention to resolve image features of less than 0.05 $\mu$m using illuminating wavelengths in the range of 5–70 nm, typically 13 nm.

Still another object of the present invention is to provide a lithographic camera relatively simple to align.

A further object of the present invention is to provide a lithographic camera using only two-mirrors with a two-reflection configuration.

A still further object of the present invention is to provide a lithographic camera for stepper and avoid scanning.

To achieve the foregoing and other objects, and in accordance with the purposes of the present invention, as embodied and broadly described herein, the apparatus of this invention may comprise two coaxial mirrors between an object and an image. In preferred embodiments the optical system is adapted for use with EUV wavelength, typically 13 nm. In a particular embodiment, with 13 nm radiation, the two-mirror optical imaging system can resolve image features less than 0.05 $\mu$m over an image field of at least 22 mm×22mm with numerical aperture larger than 0.22. The camera magnification of the present invention is variable depending on the requirements of the applications.

According to the theory of aberration developed by the present invention, the optical system comprises, from long to short conjugate, a first convex and a second concave mirrors. It is preferred that these mirrors are aspheric and coaxial, the radiuses of the mirror surfaces at the vertex are substantially equal, and the parameters substantially meet the following relationships:

$$m_2 = \pm \sqrt{\frac{1+m^2}{2}},$$

$$a = \frac{1-m+2m_2}{1+m},$$

where m is the reduction magnification of this optical system, $m_2$ is the magnification of the second mirror, a is the ratio of the paraxial ray heights ($h_2/h_1$).

Additional objects, new features and advantages of the present invention will be set forth in part in the following description. Further scope of applicability of the present invention will become apparent from the detail description of the invention provided hereinafter. It should be understood, however, that the detailed description of the invention and the specific examples presented, while indicating preferred embodiment of present invention, are provided for illustration purposes only because various changes and modifications within the scope and spirit of the present invention will become apparent to those of ordinary skill in the art from the detail description of the invention that follows.

BRIEF DESCRIPTION OF THE DRAWINGS

The accompanying drawings serve to explain the principles of the invention, in which.

DETAILED DESCRIPTION OF THE INVENTION

I. Theory of Aberration

Figure 1:
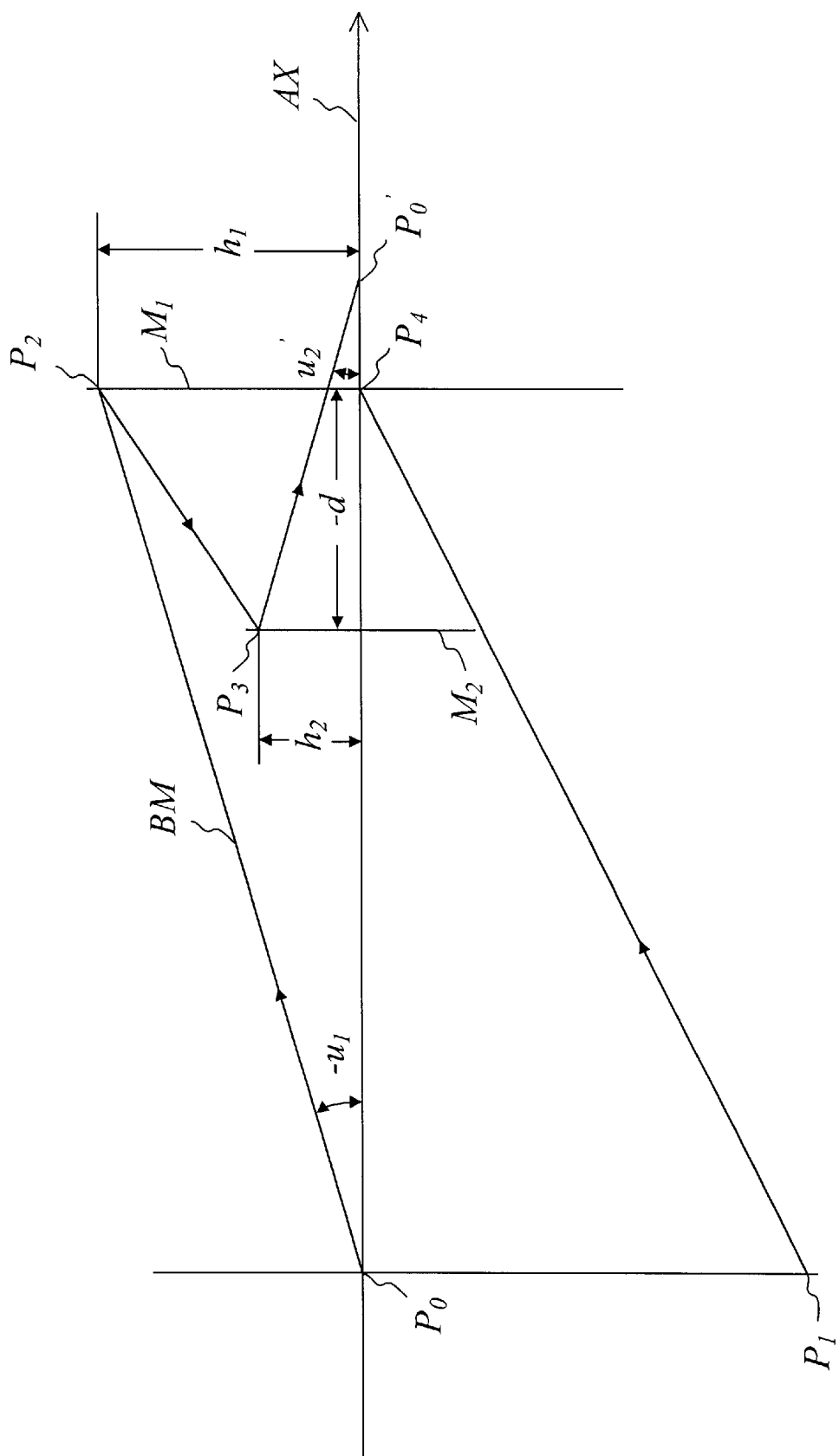
FIG. 1 is a schematic illustration showing the paraxial ray tracing through a two-mirror optical system in accordance with the present invention.

Referring first to FIG. 1, there is shown in schematic illustration the paraxial ray tracing through a two-mirror optical system in accordance with the present invention.

In FIG. 1, $M_1$ and $M_2$ are aspheric mirrors with the vertex curvature $c_1$ and $c_2$, respectively. The two mirrors have a common axis of symmetry AX. The aspheric surfaces are characterized by a conventional formula:

$$x = \frac{ch^2}{1+\sqrt{1+(k-1)c^2h^2}} + b_1h^2 + b_2h^4 + b_3h^6 + b_4h^8 + b_5h^{10} \quad (1)$$

where x is the sag of surface parallel to AX axis, c is the vertex curvature of the surface, k is the conic constant, $b_1$, $b_2$, $b_3$, $b_4$, $b_5$ are aspheric constant. For a conic surface, $b_1=b_2=b_3=b_4=b_5=0$. In the formula, $h^2=y^2+z^2$, i.e. h is the height above the AX axis. Object and image planes are also coaxial with reference to the axis AX, and they are normal to axis AX. Object point $P_0$ lies on the axis, we trace a ray BM from $P_0$ with a slope angle $u_1$. The incident point $P_2$ on mirror $M_1$ has a paraxial ray height $h_1$. The ray is then reflected by $M_1$ to point $P_3$ on mirror $M_2$ with a slope angle of $u_2=u_1'$. The paraxial ray height of $P_3$ is $h_2$. Reflection from $M_2$ results in the ray through image point $P_0'$ at axis AX with a slope angle $u_2'$. Likewise, we can trace the paraxial principle ray from object point $P_1$. For the simplicity of formularization, we trace the principle ray through the vertex $P_4$ of $M_1$, so the paraxial principal ray height $hp_1=0$. We also choose a normalization condition:

$$h_1 = j = u_2' = 1 \quad (2)$$

where j is the Lagrange invariant. For the successive reflective imaging, the magnification is $m=m_1m_2$ and:

$$\begin{cases} m_1 u_1' = u_1, \\ m_2 u_2' = u_2, \\ m u_2' = u_1. \end{cases} \quad (3)$$

When the objective plane at the infinity, $u_1=0$, then $m=0$. Define parameter a as:

$$a = \frac{h_2}{h_1}, \quad (4)$$

Then, the paraxial principal ray height at $M_2$ is $$hp_2 = \frac{a-1}{m_2}, \text{ and} \quad (5)$$

$$\begin{cases} c_1 = \frac{m+m_2}{2}, \\ c_2 = \frac{1+m_2}{2a}, \\ d = \frac{1-a}{m_2}, \end{cases} \quad (6)$$

where d is the axial distance between $M_1$ and $M_2$.

If two mirror $M_1$ and $M_2$ are conic surfaces, then the Seidal aberration can be expressed as:

$$4S_1 = (m^2 - m_2^2)(m_2 - m) + k_1(m_2 + m)^3 + a(1-m_2^2)(1-m_2) - ak_2(1+m_2)^3, \quad (7)$$

$$S_2 = \frac{m^2-1}{2} + \frac{1-a}{4m_2}[k_2(1+m_2)^3 - (1-m_2^2)(1-m_2)], \quad (8)$$

$$S_3 = \frac{(1-a)^2}{4m_2^2 a}[(1-m_2^2)(1-m_2) - k_2(1+m_2)^3] + \frac{(1-a)(1-m_2^2)}{am_2} + \frac{1+m_2}{a} - (m_2+m), \quad (9)$$

$$S_4 = m_2 + m - \frac{1+m_2}{a}. \quad (10)$$

Therefore, if we wanted to correct Seidal aberration, we can get the relationship between the parameters as the following:

If $S_4=0$, then $$a = \frac{1+m_2}{m_2+m}. \quad (11)$$

If $S_3=0$, then $$k_2 = \frac{1}{(1+m_2)^3}\left[\frac{4m_2}{(1-a)^2}(1-a+m_2-am m_2) + (1-m_2^2)(1-m_2)\right]. \quad (12)$$

If $S_2=0$, then $$k_2 = \frac{1}{(1+m_2)^3}\left[\frac{2m_2(1-m^2)}{1-a} + (1-m_2^2)(1-m_2)\right]. \quad (13)$$

If $S_2=S_3=0$, then $$a = \frac{1+2m_2+m^2}{1+2mm_2+m^2}. \quad (14)$$

If $S_2=S_3=S_4=0$, then $$\begin{cases} m_2 = \pm\sqrt{\dfrac{1+m^2}{2}}, \\ a = \dfrac{1-m\pm 2\sqrt{\dfrac{1+m^2}{2}}}{1+m}. \end{cases} \quad (15)$$

This shows that when coma, astigmatism, and field curvature are corrected simultaneously, the magnification m determines all the structural parameters including conic constant $k_2$. The conic constant $k_1$ will be determined by correcting spherical aberration $S_1$. Therefore, the system achieves both stigmatic image and flat field.

In general, two solutions can be obtained from equation (15). For example, taking $m=-1/6$, then:

$$\begin{cases} m_2 = 0.7169; -0.7169, \\ a = 3.12; -0.32, \\ c_1 = c_2 = 1/3.635; 1/(-2.264), \\ d = -2.9578, \end{cases} \quad (16)$$

but, if $m_2<0$ and $a<0$, the image point is imaginary. So only one solution has real focus plane, and conic constants of two mirrors are $$\begin{cases} k_1 = -9.7373 \\ k_2 = -0.1027. \end{cases} \quad (17)$$

This two-mirror optical system does not correct distortion $S_5$. There are two basic system configurations that are useful for EUV lithography, which are determined by the limitations in the optical design. These are:

(1) non-scanning systems with large image field. In these systems distortion is not corrected but reduced. A small amount of residual distortion in the image may be compensated by pre-distorting the mask; and
(2) scanning ring-field systems with almost exactly the same distortion within the narrow ring width.

The systems described in the present invention are the first type of systems.

II. Detailed Description and Some Exemplary Preferred Embodiments

Figure 2:
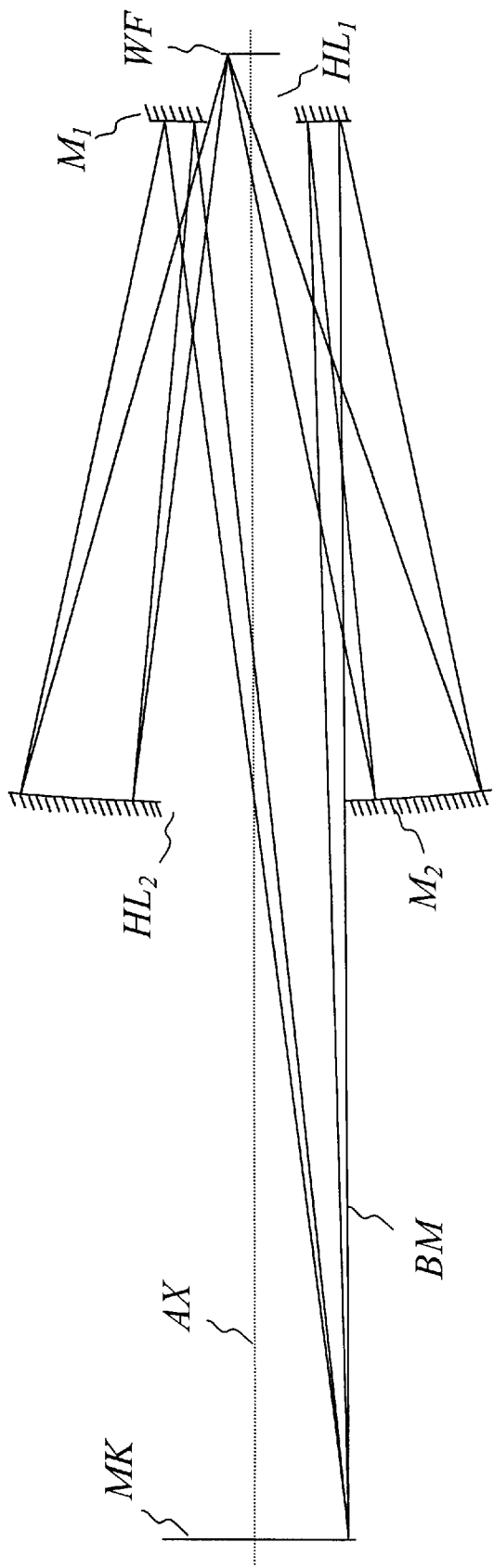
FIG. 2 is a schematic drawing in cross-section of a two-mirror projection reflection optical system according to the present invention.

Referring to FIG. 2, there is shown in schematic illustration the two-mirror projection lithography camera in accordance with the present invention. The camera optical system comprises the reflecting optics disposed between mask MK and wafer WF. Based on the theory of aberration developed in the present invention, said reflecting optics is a reflecting system comprising a first convex reflecting surface $M_1$ defining a hole ($HL_1$) therethrough for exiting beam to wafer WF, a second concave reflecting surface $M_2$ defining a hole ($HL_2$) therethrough for admitting photons from mask MK. It is preferred that the two mirrors are aspheric and coaxial with axis AX. It is also preferred that the radiuses at the vertex of the two mirror surfaces are substantially equal, and the parameters for the mirrors substantially meet the following relationships:

$$m_2 = \pm\sqrt{\dfrac{1+m^2}{2}}$$

$$a = \dfrac{1-m+2m_2}{1+m}$$

where m is the reduction magnification of this optical system, $m_2$ is the magnification of the second mirror, a is the ratio of the paraxial ray heights ($h_2/h_1$). All of the structure parameters can be determined by a and $m_2$ based on equations (6), (7), and (12) when the normalization condition [equation (2)] is satisfied.

In FIG. 2, beam BM produced by a radiation source (not shown) emits from point $P_1$ of mask MK, reflects on mirror $M_1$ and $M_2$, and focused on wafer WF to form a reduced image of MK on WF. The radiation source is preferably an EUV source that can be from a laser plasma source, a synchrotron, a free electron laser (FEL), or from any other sources that can generate radiation with a wavelength range useful for lithography, e.g. from discharge plasma. It is obvious that the mask MK can be either a transmission mask or a reflection mask. The camera magnification of the present invention is variable depending on the requirements of the applications.

The camera system is partially obscured because any radiation that reaches holes on the mirrors can not be reflected. Depend on design parameters, the obscuration can be different. If necessary, an obscurator can be used in the optical imaging system to prevent unwanted radiation to reach wafer.

Figure 3:
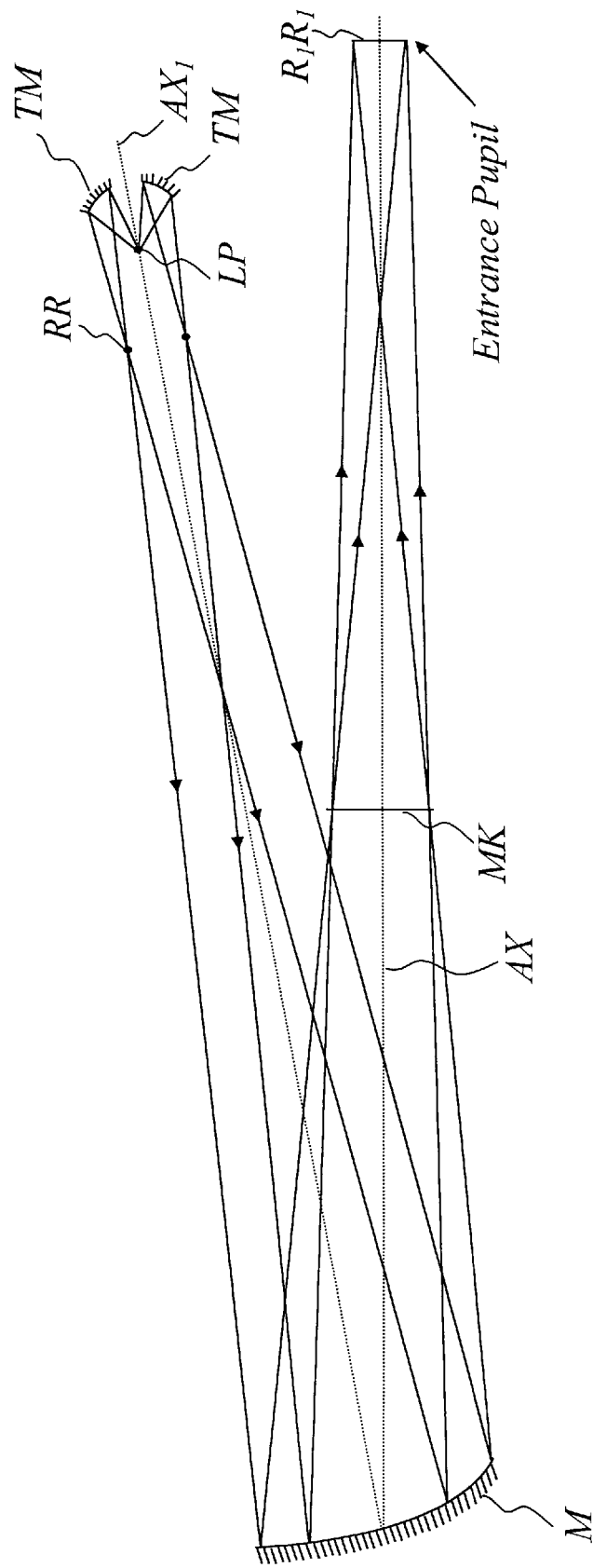
FIG. 3 is a schematic drawing showing a condenser that can be used as the illumination system for the present invention.
Figure 4:
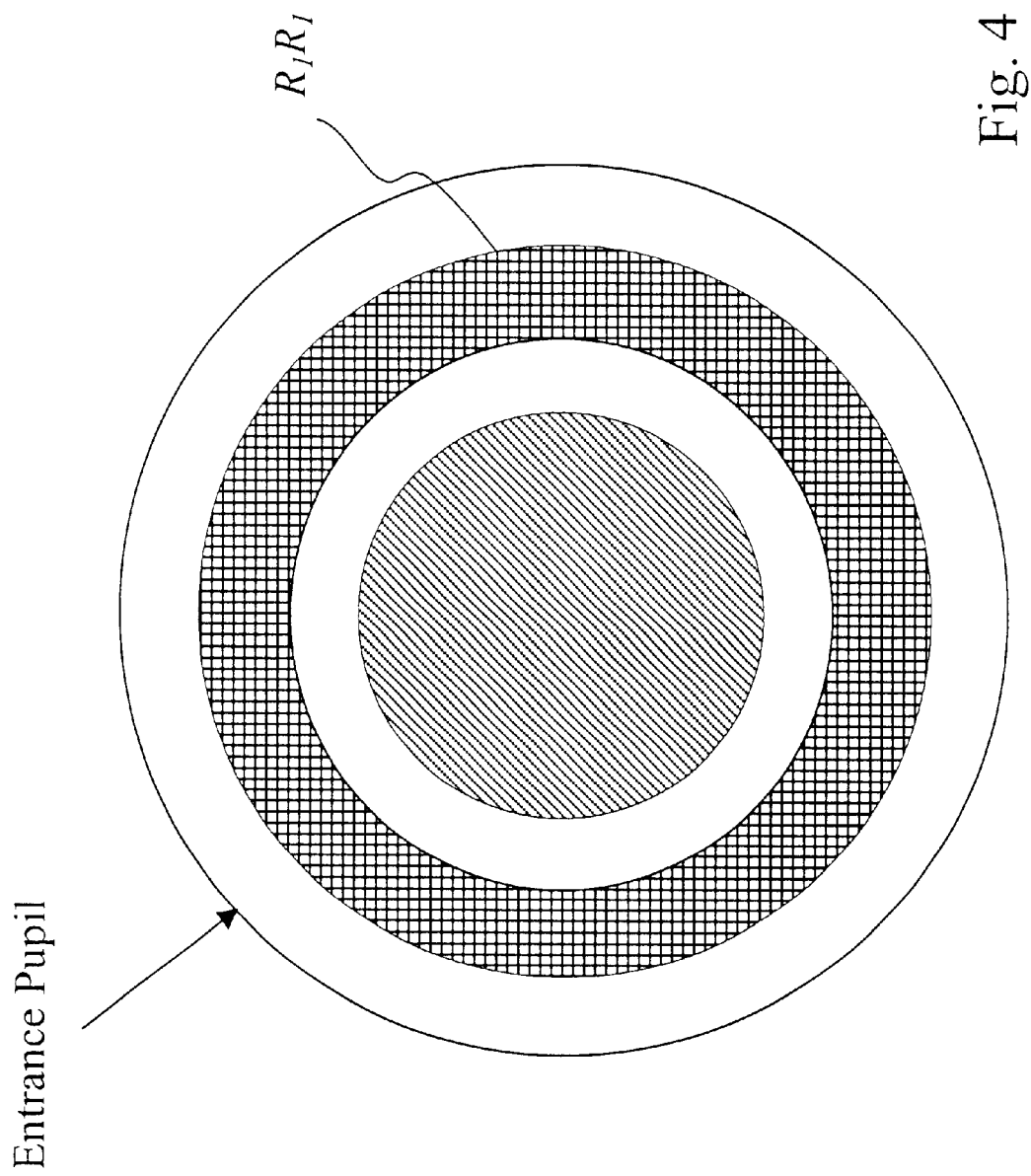
FIG. 4 is a schematic drawing of the cross-section of the entrance pupil of the two-mirror projection optical system wherein $R_1R_1$ is the image of the radiation source showing in FIG. 3.

In order to avoid the beam from mask to reach wafer directly without being reflected by the mirrors, it is preferred that the radiation source of a lithography system forms an image at the entrance pupil of the two-mirror camera optical system as shown in FIG. 3. In this example of a Kohler condenser, laser plasma is used as the radiation source. In this example, a transmission mask is used. In FIG. 3, $AX_1$ is the optical axis of the condenser, which becomes the optical axis AX of the two-mirror optical system after reflection by M. LP is the laser plasma source located on $AX_1$ axis. The radiation beam from this source is imaged by an annular toroid mirror TM to form an annular radiation source at RR, and then is further imaged by M at $R_1R_1$. Both TM and RR are symmetric with the $AX_1$ axis. $R_1R_1$ coincides with the entrance pupil of the two-mirror optical system so that the mask can be uniformly illuminated. FIG. 4 is the illustration of the cross-section of the entrance pupil resulted from such condenser design. The line shadow section is the "obscured" portion determined by the two-mirror objective design. Essentially, there is no direct beam from the radiation source passing through this obscured section. The grid shadow section is the image of the laser plasma source LP.

When LP forms the image on the entrance pupil, the magnification can be varied by the selection of curvatures of TM and M. It is possible to make image at $R_1R_1$ fill the entrance pupil, and it is also possible to incompletely fill the entrance pupil due to the requirement to the degree of coherence. On the other hand, although the beam from LP source will not reach wafer directly, it is possible that the scattered radiation from mask could reach wafer. Therefore, using stray light stop will help to reduce possible stray light and improve the contrast. For those skilled in the art, it is straightforward to combine the schemes in FIG. 2 and FIG. 3 to form a lithography system including radiation source and condenser for high resolution lithography.

Figure 5:
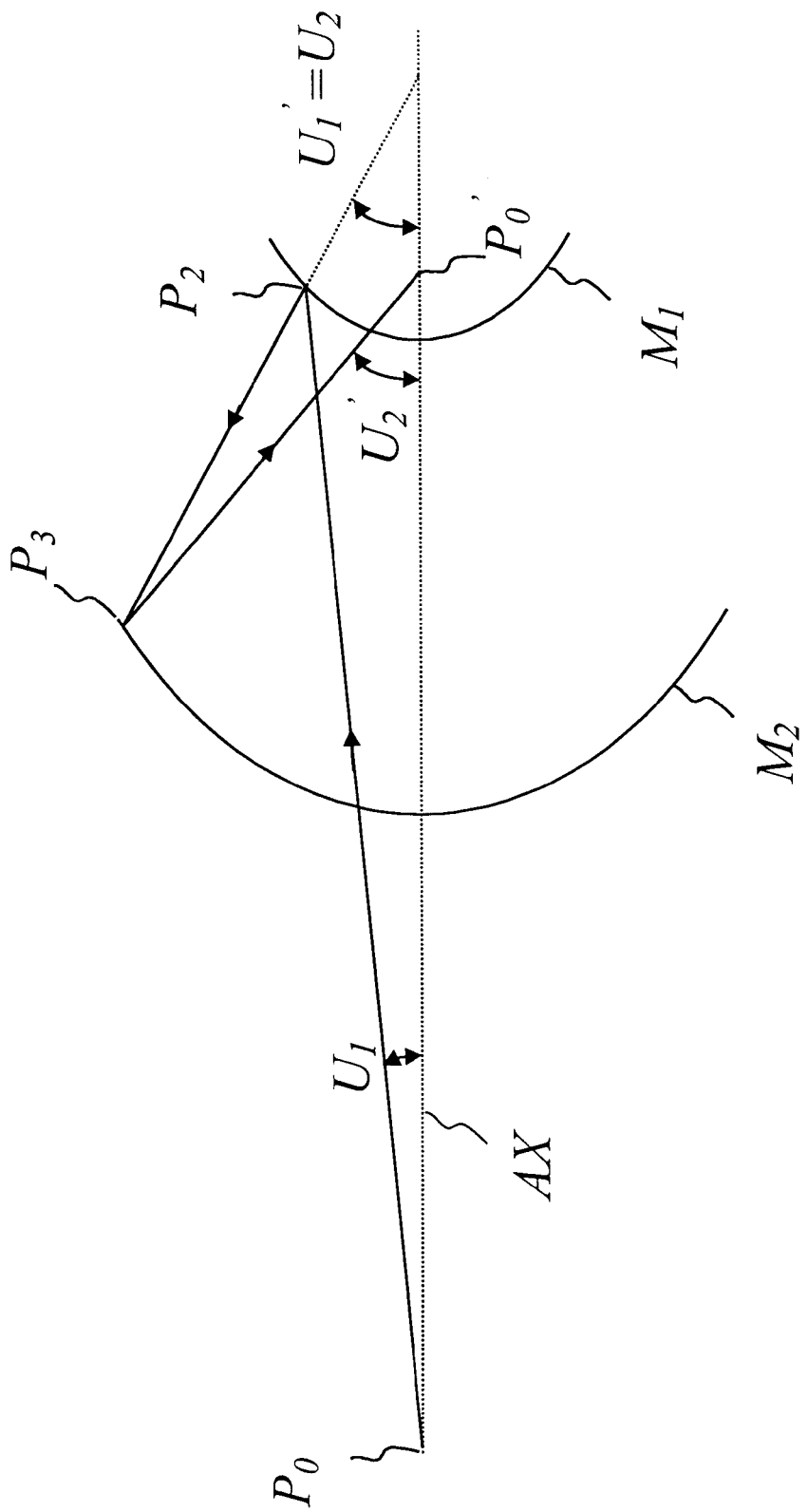
FIG. 5 is a schematic illustration showing the incident angles of a ray from an object point on the optical axis.

The importance of coatings for the optical system should be described also. It is known that multi-layer mirror coatings for EUV waveband are only reflective over a narrow bandwidth and within a small range of incidence angles. The angles of radiation incident upon each mirror must vary by less than 8°. (Cohen et al, OSA Proceedings on EUV Lithography V.23, 1994, p109). All the two-mirror optical designs according to the present invention meet this requirement. Referring to FIG. 5, there is shown in schematic illustration the incident angles of a ray from a point on the optical axis. This optical system has a reduced magnification of 6× and NA 0.22. From the theory of present invention, magnification of each mirror as well as the slope angles can be determined as shown in FIG. 5. In FIG. 5, slope angle $U_1=2°$, $U_1'=U_2=9°$, and $U_2'=12.7°$, and therefore, the incident angles at mirror $M_1$ are less than 5.5° and at mirror $M_2$ are less than 2°.

Figure 6:
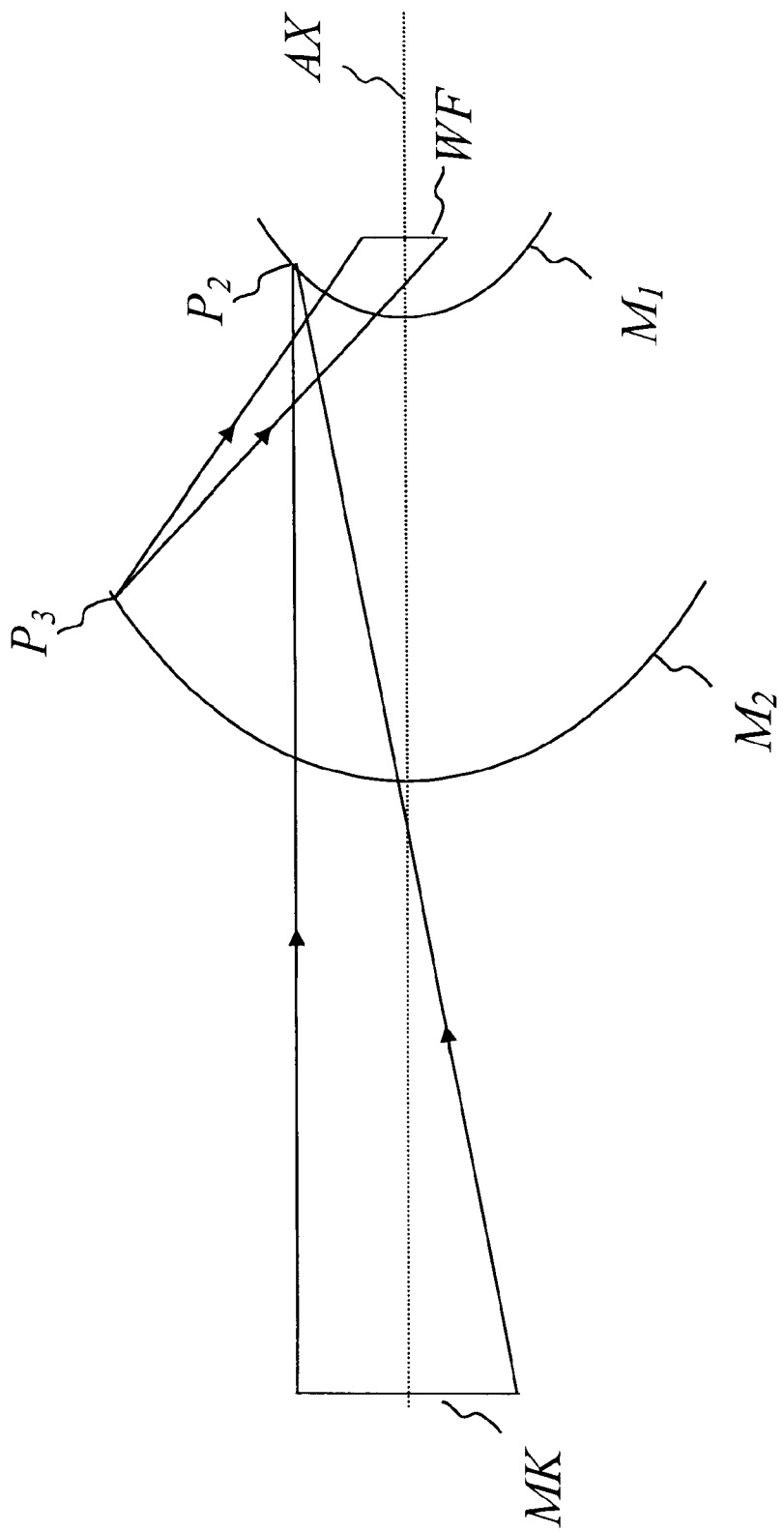
FIG. 6 is a schematic drawing indicating the range of incidence angles for off-axial object points.

For off-axis objects, the range of incidence angles for any point on mirror $M_1$ is determined by object diameter divided by object distance, and it is typically within ±2.5°. The range of incidence angles for any point on mirror $M_2$ is determined by image diameter divided by image distance, and it is typically within ±1° as shown in FIG. 6.

Therefore, the range of incidence angles for mirror $M_2$ is always less than 3°, and it is always less than 8° for mirror $M_1$. It is preferred to vary the film thickness of mirror $M_1$ from vertex to the edge according to different incident angles, so that a thickness gradient of coating is formed from vertex to the edge with the coating at the edge being thicker. In this case, incidence angle at any point of mirror $M_1$ will be less than 5°. With this arrangement, very high reflectivity of EUV radiation can be accomplished with the two-mirror optical systems described in the present invention.

In summary, a novel reflective optical system for lithography is disclosed in the present invention. The optical system comprises only two mirrors with a two-reflection configuration. In preferred embodiments, the two mirrors are arranged on a common axis of symmetry such that efficient use of extreme ultraviolet radiation can be achieved. In a particular embodiment for EUV lithography, with 13 nm radiation, the two-mirror optical imaging system can resolve image features less than 0.05 μm over an image field of at least 22 mm×22 mm with numerical aperture larger than 0.22.

When the projection system is incorporated into a stepper, wafer with an arbitrarily large diameter is stepped by a conventional precision translation mechanism to expose a plurality of different image fields each having a predetermined dimension.

Although having a central obscuration in the optical system, the NA (0.22) and the solid angle of the radiation beam in the present invention are much larger than those shown in the prior art (NA 0.1 or less). The field-of-view of the present invention is also much larger than the ring-field system described in the prior art. As a result, the efficiency of radiation utilization can be more than ten times higher than what has been reported in literature.

The results obtained in the present invention are surprising because the designs provide reflection imaging systems of high performance that are simple to align (two coaxial reflecting surfaces) and useful for EUV lithography.

To illustrate the capability of the present invention, some design examples are described as follows with the design parameters listed. It is apparent to those skilled in the art that some slight modifications could be made for practical applications, such as rounding up decimal places.

Design 1

From the theory developed in the present invention, a two-mirror 6× optical system designed with parameters shown in equation (16) and (17). In this design, an appropriate NA and field-of-view are defined according to the high order aberration, and the aberration correction is optimized by changing the aperture stop position. For illustration purpose, reader can refer to FIG. 2 for the scheme of this design. Mask MK is illuminated with an EUV source (not shown), the beam BM from off-axis point $P_1$ of mask MK is reflected by mirror $M_1$ and $M_2$, and focused at wafer WF to form a reduced image of MK on WF. Both mirrors $M_1$ and $M_2$ have a hole therethrough for admitting beam. The reflection of central portion of beam BM is blocked due to the presence of these holes on mirrors.

The results are summarized as shown in Table 1.

TABLE 1

|  | RD | TH | AP | k |
|---|---|---|---|---|
| Object | ∞ | 6 | 1 | 0 |
| Mirror 1 | 3.635 | −0.6578 | 0.4421 | −9.7373 |
| Stop | ∞ | −2.3 | 0.5682 | 0 |
| Mirror 2 | 3.635 | 3.1205 | 1.3836 | −0.1027 |
| Image | ∞ |  | 0.1656 | 0 |

NA=0.37, WL=550, WFE0<0.05λ, WFE1<0.1λ

In this and other designs that follow, the design parameters are:

| | |
|---|---|
| RD | radius of curvature at vertex (mm) |
| TH | separation between surfaces (mm) |
| AP | aperture radius or object or image height (mm) |
| NA | numerical aperture in image space |
| WL | wavelength (nm) |
| k, $b_1$, $b_2$, $b_3$, $b_4$, $b_5$ | aspheric coefficient |
| WFE0 | wave front error maximum of axial object |
| WFE1 | wave front error maximum of off-axial object |

Design 2

The design 1 was scaled and optimized with even aspheric mirrors using conventional techniques well known to those of ordinary skill in the art. One resulting design is summarized below in Tables 2.

TABLE 2

|  | RD | TH | AP | k | $b_3$ | $b_4$ |
|---|---|---|---|---|---|---|
| Object | ∞ | 3000 | 92.8 | 0 | 0 | 0 |
| Mirror 1 | 1752.447 | −1416.005 | 120.0 (35) | −9.6255 | −9.2813e−17 | −8.4965e−22 |
| Stop, Mirror 2 | 1746.822 | 1498.313 | 329.2 (109) | −0.1047 | 1.3045e−19 | −3.4846e−27 |
| Image | ∞ |  | 15.0 | 0 | 0 | 0 |

NA=0.22, WL=13, WFE0<0.02λ, WFE1<0.05λ

In Table 2, the radiuses of holes on mirrors were also shown in parenthesis in AP column. Therefore, the obscuration of this design is 0.11, i.e. 11% of aperture area is blocked by the holes. The system from this design forms a reduced (6×) image of mask on the wafer with the maximum distortion at the field edge being less than 6 μm. The system has the ability to print 0.05 μm features over an entire 30 mm field. For illustration purpose, reader can refer to FIG. 2 for the scheme of this design.

Design 3

The result of Design 3 is shown in Table 3.

TABLE 3

|  | RD | TH | AP | k | $b_3$ | $b_4$ |
|---|---|---|---|---|---|---|
| Object | ∞ | 1680 | 92.9 | 0 | 0 | 0 |
| Mirror 1 | 981.3703 | −793.2088 | 52.9 (21.9) | −9.6131 | −1.38e−15 | −1.04e−19 |
| Stop, Mirror 2 | 978.6058 | 839.4965 | 140.3 (76.8) | −0.1046 | 3.09e−18 | −2.22e−23 |
| Image | ∞ |  | 15.0 | 0 | 0 | 0 |

NA=0.166, WL=13, WFE0<0.02λ, WFE1<0.05λ

The system from Design 3, like from Design 2, forms a reduced (6×) image, but the total length and the mirror diameter are about half of those for Design 2. This design results in a system with the center obscuration of 30%, with the NA being reduced to 0.166. The maximum distortion at the field edge is less than 19 μm. The field-of-view is the same as in Design 2. This system can be used for printing 0.1 μm features over an entire 30 mm field.

Design 4

The result of Design 4 is shown in Table 4.

TABLE 4

|  | RD | TH | AP | k | $b_2$ | $b_3$ | $b_4$ | $b_5$ | $b_6$ |
|---|---|---|---|---|---|---|---|---|---|
| Object | ∞ | 1680 | 92.9 | 0 | 0 | 0 | 0 | 0 | 0 |
| Mirror 1 | 981.3703 | −793.1932 | 52.9 (21.9) | 8.8957 | 2.448e−9 | 1.34e−15 | 3.969e−19 | −1.063e−22 | 9.855e−27 |
| Mirror 2 & Stop | 978.5919 | 839.4840 | 140.3 (76.8) | −0.1046 | 0 | 2.868e−18 | −1.687e−23 | −2.444e−33 | −2.478e−38 |
| Image | ∞ |  | 15.0 | 0 | 0 | 0 | 0 | 0 | 0 |

NA=0.166, WL=13, WFE0<0.02λ, WFE1<0.05λ

Design 4 and Design 3 are only different in aspheric coefficient. Although conic constants ($k_2$) in these two designs seem to be very different, since $b_2$ has the same effect as k, the actual difference between these two designs is quite small. Comparing with Design 3, the image quality in Design 4 is slightly improved.

Design 5

The result of Design 5 is shown in Table 5.

TABLE 5

|  | RD | TH | AP | k | $b_3$ | $b_4$ |
|---|---|---|---|---|---|---|
| Object | ∞ | 2000 | 76 | 0 | 0 | 0 |
| Mirror 1 | 1535.184 | −1272.147 | 101.9 (27) | −10.9602 | −2.7437e−16 | −2.5652e−21 |
| Stop, Mirror 2 | 1529.695 | 1315.687 | 289.2 (90) | −0.0920 | 2.3685e−19 | 1.0172e−25 |
| Image | ∞ |  | 15.2 | 0 | 0 | 0 |

NA=0.22, WL=13, WFE0<0.02λ, WFE1<0.05λ

The system from Design 5 forms a reduced image (5×) with the mirror diameters similar with those in Design 2. The obscuration of this design is 10%. The maximum distortion at the field edge is less than 8 μm. This system also has the ability to print 0.05 μm features over an entire 30 mm field.

Design 6

The result of Design 6 is shown in Table 6.

TABLE 6

|  | RD | TH | AP | k | $b_2$ | $b_3$ | $b_4$ | $b_5$ |
|---|---|---|---|---|---|---|---|---|
| Object | ∞ | 2500 | 122 | 0 | 0 | 0 | 0 | 0 |
| Mirror 1 | 1051.4682 | −825.5573 | 75.9 (29) | 2.6058 | 1.194e−9 | 3.577e−15 | 5.893e−22 | −1.074e−24 |
| Stop, Mirror 2 | 1047.6168 | 896.5327 | 181.5 (91) | −0.1186 | 0 | 1.860e−18 | 5.028e−24 | −1.936e−28 |
| Image | ∞ |  | 15.0 | 0 | 0 | 0 | 0 | 0 |

NA=0.2, WL=13, WFE0<0.03λ, WFE1<0.1λ

The system from Design 6 forms a reduced image (8×). The obscuration of this design is 25%. The maximum distortion at the field edge is less than 15 μm. This system therefore has the ability to print 0.08 μm features over an entire 30 mm field.

Design 7

All the designs described above have a central obscuration. This design shows the capability of the present invention in providing off-axial systems.

Figure 7:
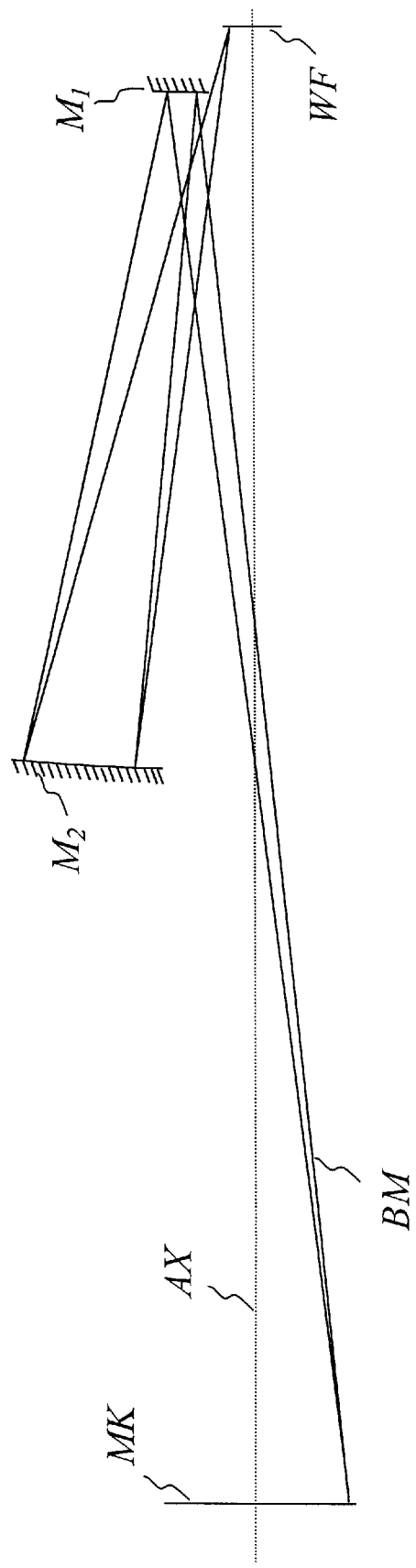
FIG. 7 is a schematic illustration of an off-axial, unobscured, two-mirror projection reflection system.

FIG. 7 shows a design using only half of the optical system described in Design 2. For example, the aperture of mirror $M_1$ in FIG. 7 is half of that in Design 2 with the radius of $M_1$ unchanged. Here, an off-axial, unobscured system is obtained, which has NA 0.1 along with a large field-of-view (a non-ring field system). In this design, the image diameter is still 30 mm.

The results are summarized below in Tables 7.

TABLE 7

|  | RD | TH | AP | k | $b_3$ | $b_4$ |
|---|---|---|---|---|---|---|
| Object | ∞ | 3000 | 92.8 | 0 | 0 | 0 |
| Mirror 1 | 1752.447 | −1416.005 | 60 | −9.6255 | −9.2813e−17 | −8.4965e−22 |
| Stop, Mirror 2 | 1746.822 | 1498.313 | 165 | −0.1047 | 1.3045e−19 | −3.4846e−27 |
| Image | ∞ |  | 15.0 | 0 | 0 | 0 |

NA=0.1, WL=13, WFE0<0.02λ, WFE1<0.05λ

It is believed that the many other advantages of this invention will be apparent to those skilled in the art. It will also be apparent that a number of variations and modifications may be made in the present invention without departing from its spirit and scope. For example, it is apparent that the two-mirror optical system described in the present invention can also be used as a lithography camera for excimer laser waveband to form images with NA 0.4, field-of-view of 30 mm and resolution of 0.25 μm. Accordingly, the foregoing description is to be construed as illustrative only, rather than limiting. This invention is limited only by the scope of the following claims.

What is claimed is:

1. An imaging apparatus comprising:

a projection optical system comprising, from long to short conjugate, a first convex mirror and a second concave mirror, characterized in that said mirrors have the structural parameters meeting substantially the following relationships:

$$m_2 = \pm\sqrt{\frac{1+m^2}{2}}$$

-continued $$a = \frac{1-m+2m_2}{1+m}$$

wherein m is the reduction magnification of said projection optical system, $m_2$ is the magnification of the second mirror, and a is the ratio of the paraxial ray heights ($h_2/h_1$).

2. The imaging apparatus of claim 1, wherein said mirrors are coaxial, aspheric with substantially the same radius at vertex, and each said mirror has a hole for transmission of light beams.

3. The imaging apparatus of claim 1, wherein said mirrors are off-axial, aspheric with substantially the same radius at vertex and said projection optical system is an unobscured system.

4. The imaging apparatus of claim 1, further including a radiation source for illumination; and a mask illuminated by said radiation source for generating patterned images onto a substrate, wherein said projection optical system is positioned between said mask and said substrate.

5. The imaging apparatus of claim 4, wherein said radiation source is an extreme ultraviolet source of wavelengths in the range of 5–70 nanometers.

6. The imaging apparatus of claim 4, wherein said extreme ultraviolet source is a laser plasma source.

7. The imaging apparatus of claim 6, further including a Kohler condenser system comprising two mirrors, wherein one of said two mirrors in said condenser system is an annular toroid mirror, wherein said laser plasma source is imaged by said Kohler condenser system to form an image on the entrance pupil of said projection optical system, whereby said mask is illuminated uniformly.

8. The imaging apparatus of claim 4, wherein said radiation source is an excimer laser source.

* * * * *